United States Patent
Lin et al.

(10) Patent No.: US 7,968,455 B2
(45) Date of Patent: Jun. 28, 2011

(54) COPPER DEPOSITION FOR FILLING FEATURES IN MANUFACTURE OF MICROELECTRONIC DEVICES

(75) Inventors: Xuan Lin, Northford, CT (US); Richard Hurtubise, Clinton, CT (US); Vincent Paneccasio, Madison, CT (US); Qingyun Chen, Branford, CT (US)

(73) Assignee: Enthone Inc., New Haven, CT (US)

( * ) Notice: Subject to any disclaimer, the term of this patent is extended or adjusted under 35 U.S.C. 154(b) by 0 days.

(21) Appl. No.: 12/446,176

(22) PCT Filed: Oct. 17, 2007

(86) PCT No.: PCT/US2007/081671
§ 371 (c)(1),
(2), (4) Date: Apr. 17, 2009

(87) PCT Pub. No.: WO2008/049019
PCT Pub. Date: Apr. 24, 2008

(65) Prior Publication Data
US 2010/0285660 A1 Nov. 11, 2010

Related U.S. Application Data

(60) Provisional application No. 60/829,797, filed on Oct. 17, 2006, provisional application No. 60/887,233, filed on Jan. 30, 2007.

(51) Int. Cl.
*H01L 21/4763* (2006.01)
(52) U.S. Cl. . 438/642; 438/643; 438/644; 257/E23.161; 257/E23.163
(58) Field of Classification Search .......... 438/642, 438/643, 648; 257/E23.161, E23.163
See application file for complete search history.

(56) References Cited

U.S. PATENT DOCUMENTS

| | | | |
|---|---|---|---|
| 6,221,230 B1* | 4/2001 | Takeuchi et al. | 205/133 |
| 6,399,479 B1* | 6/2002 | Chen et al. | 438/628 |
| 6,610,596 B1* | 8/2003 | Lee et al. | 438/653 |
| 6,713,373 B1* | 3/2004 | Omstead | 438/608 |
| 6,897,152 B2 | 5/2005 | Verbunt | |
| 2002/0008034 A1* | 1/2002 | Chen et al. | 205/82 |
| 2004/0149584 A1* | 8/2004 | Nagai et al. | 205/103 |
| 2006/0014378 A1 | 1/2006 | Aggarwal et al. | |
| 2006/0141784 A1 | 6/2006 | Paneccasio, Jr. et al. | |
| 2006/0251872 A1* | 11/2006 | Wang et al. | 428/209 |
| 2006/0254503 A1* | 11/2006 | Dai et al. | 117/84 |

OTHER PUBLICATIONS

International Search Report, PCT/US2007/081671, dated Mar. 17, 2008, 2 pages.
Written Opinion, PCT/US2007/081671, dated Mar. 17, 2008, 6 pages.
International Preliminary Report on Patentability, PCT/US2007/081671, dated Apr. 22, 2009, 7 pages.

* cited by examiner

*Primary Examiner* — Hsien-ming Lee
*Assistant Examiner* — Kevin Parendo
(74) *Attorney, Agent, or Firm* — Senniger Powers LLP

(57) ABSTRACT

A method for plating copper onto a semiconductor integrated circuit device substrate by forming an initial metal deposit in the feature which has a profile comprising metal on the bottom of the feature and a segment of the sidewalls having essentially no metal thereon, electrolessly depositing copper onto the initial metal deposit to fill the feature with copper. A method for plating copper onto a semiconductor integrated circuit device substrate by forming a deposit comprising a copper wettable metal in the feature, forming a copper-based deposit on the top-field surface, and depositing copper onto the deposit comprising the copper wettable metal to fill the feature with copper.

16 Claims, 9 Drawing Sheets

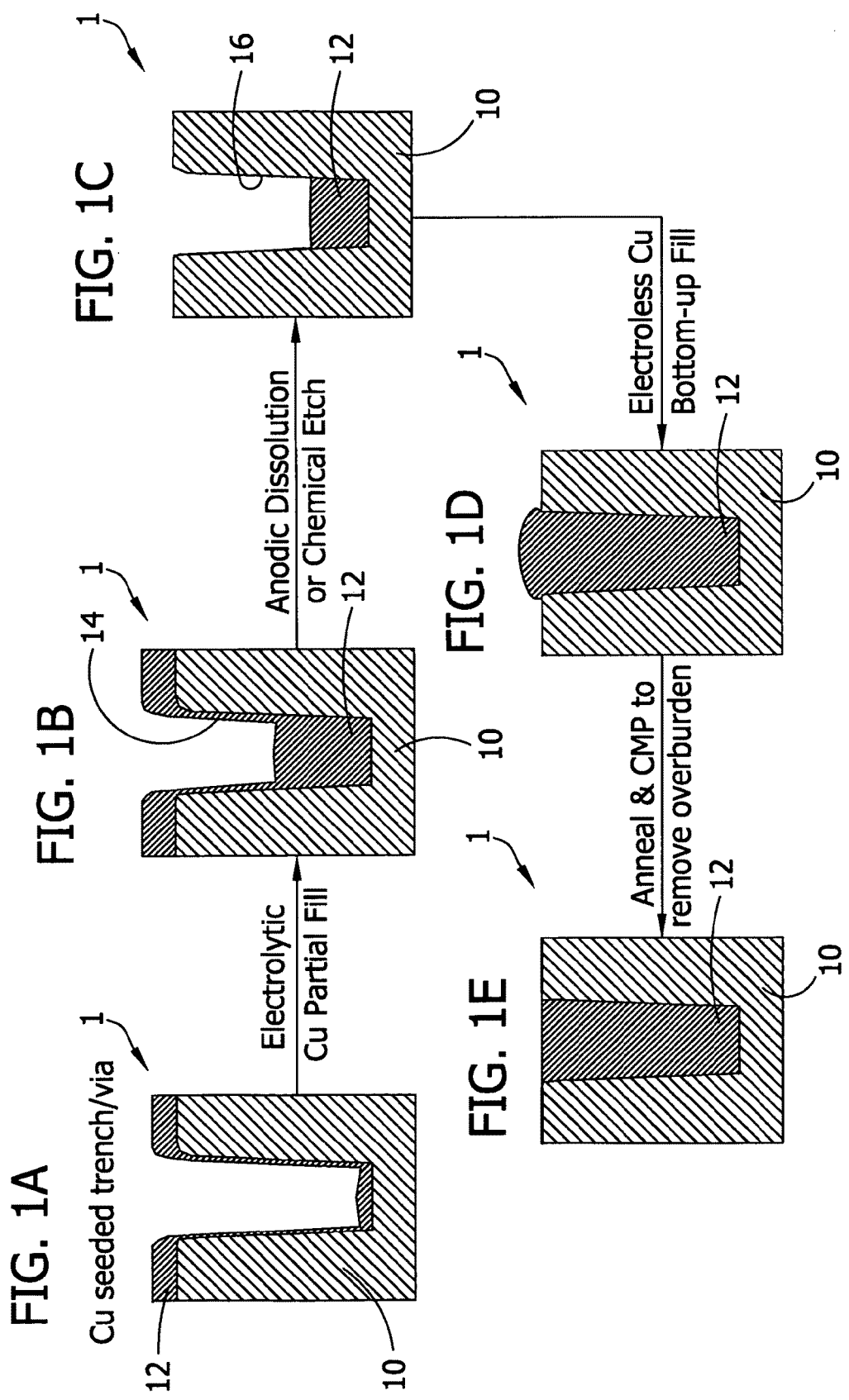

Cu seeded trench/via

Cu seeded trench/via

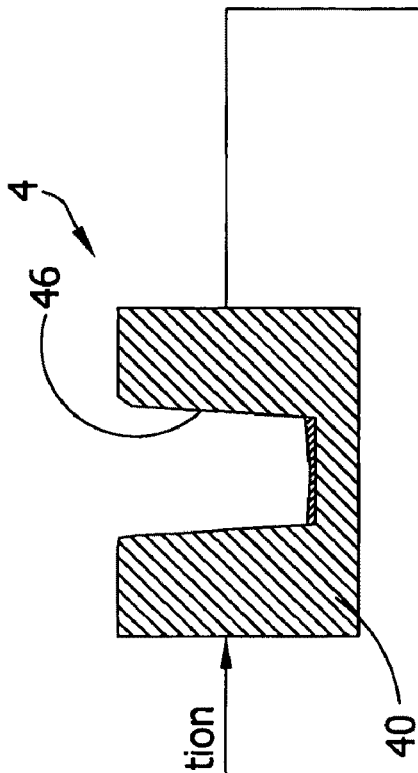
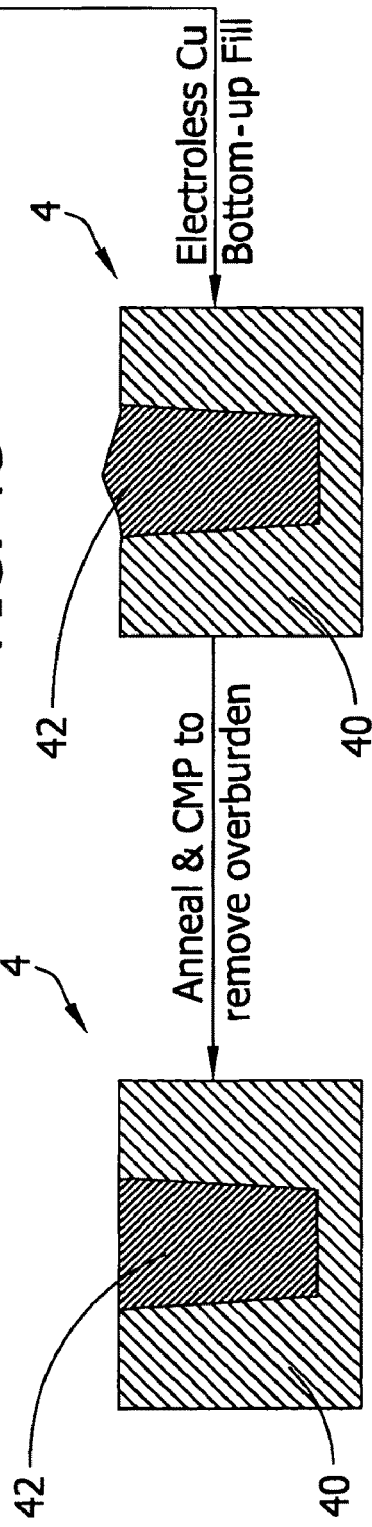
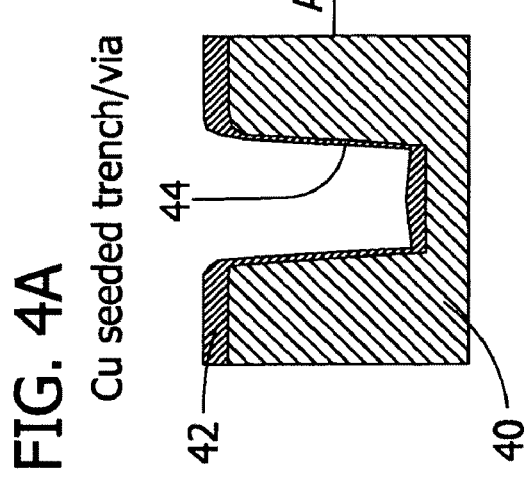
FIG. 4A
Cu seeded trench/via
FIG. 4B
Anodic Dissolution
FIG. 4C
Electroless Cu Bottom-up Fill
FIG. 4D
Anneal & CMP to remove overburden

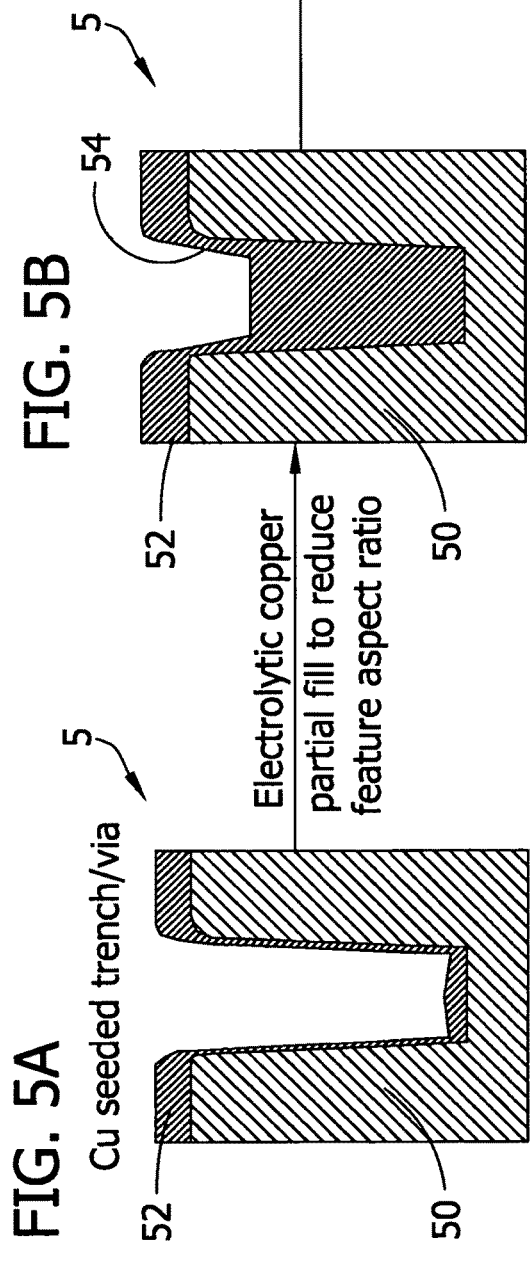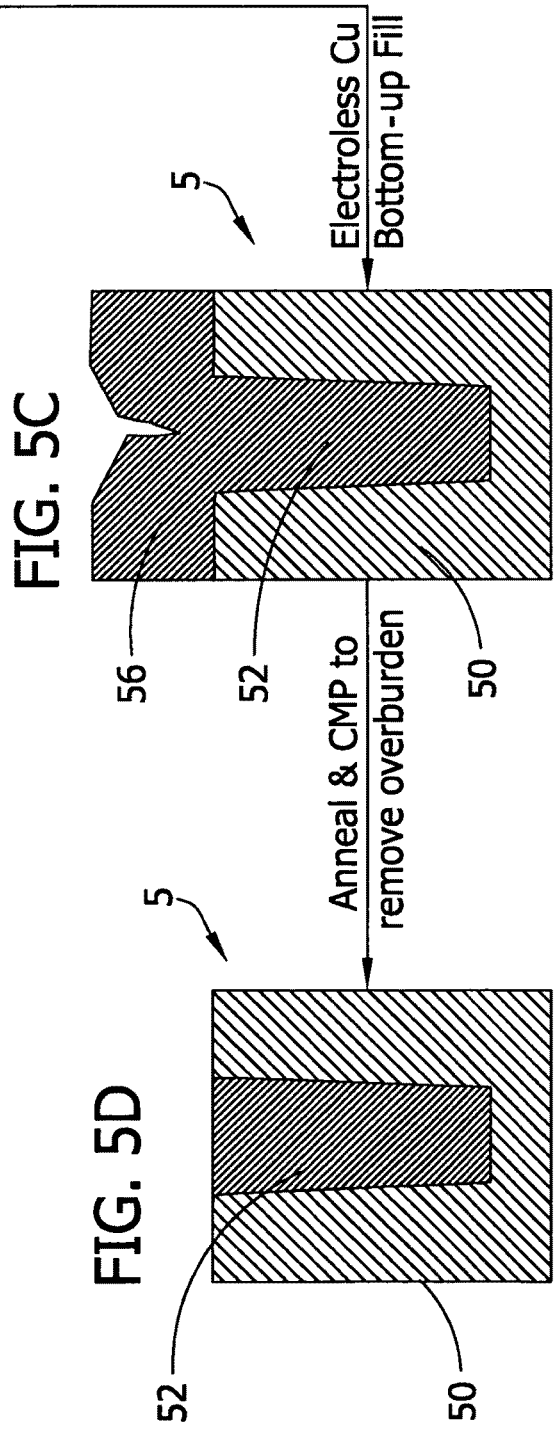

_US 7,968,455 B2_

COPPER DEPOSITION FOR FILLING FEATURES IN MANUFACTURE OF MICROELECTRONIC DEVICES

REFERENCE TO RELATED APPLICATIONS

This application is the U.S. national stage application of International Patent Application No. PCT/US2007/081671, filed Oct. 17, 2007, and claims the benefit of U.S. Provisional Application No. 60/887,233, filed Jan. 30, 2007, and U.S. Provisional Application No. 60/829,797, filed Oct. 17, 2006, the entire disclosures of which are incorporated herein by reference.

FIELD OF THE INVENTION

This invention relates to copper deposition for filling of features such as trenches and vias in microelectronic devices.

BACKGROUND OF THE INVENTION

An integrated circuit (IC) contains a collection of electrical devices, such as transistors, capacitors, resistors, and diodes, within a dielectric material on a semiconductor substrate. Conductive interconnects connecting discrete devices are referred to as trenches. Additionally, two or more conductive layers, each separated by a dielectric, are typically employed within a given IC to increase its overall performance.

Conductive interconnects known as vias are used to connect these distinct conductive layers together. Currently, ICs typically have silicon oxide as the dielectric material and copper as the conductive material.

The demand for manufacturing semiconductor IC devices such as computer chips with high circuit speed, high packing density and low power dissipation requires the downward scaling of feature sizes in ultra large scale integration (ULSI) and very large scale integration (VLSI) structures. The trend to smaller chip sizes and increased circuit density requires the miniaturization of interconnect features, which severely penalizes the overall performance of the structure because of increasing interconnect resistance and reliability concerns such as electromigration.

Traditionally, such structures had used aluminum and aluminum alloys as the metallization on silicon wafers with silicon dioxide being the dielectric material. In general, openings are formed in the dielectric layer in the shape of vias and trenches after metallization to form the interconnects. Increased miniaturization is reducing the openings to submicron sizes (e.g., 0.5 micron and lower).

To achieve further miniaturization of the device, copper has been introduced to replace aluminum as the metal to form the connection lines and interconnects in the chip. Copper metallization is carried out after forming the interconnects. Copper has a lower resistivity than aluminum and the thickness of a copper line for the same resistance can be thinner than that of an aluminum line.

The use of copper has introduced a number of requirements into the IC manufacturing process. First, copper has a tendency to diffuse into the semiconductor's junctions, thereby disturbing their electrical characteristics. To combat this occurrence, a barrier layer, such as titanium nitride, tantalum, or tantalum nitride, is applied to the dielectric prior to the copper layer's deposition. It is also necessary that the copper be deposited on the barrier layer cost-effectively while ensuring the requisite coverage thickness for carrying signals between the IC's devices. As the architecture of ICs continues to shrink, this requirement proves to be increasingly difficult to satisfy.

One conventional semiconductor manufacturing process is the copper damascene system. Specifically, this system begins by etching the circuit architecture into the substrate's dielectric material. The architecture is comprised of a combination of the aforementioned trenches and vias. Next, a barrier layer is laid over the dielectric to prevent diffusion of the subsequently applied copper layer into the substrate's junctions. Copper is then deposited onto the barrier layer using one of a number of processes, including, for example, chemical vapor deposition (CVD), physical vapor deposition (PVD), or electrochemical deposition. After the copper layer has been deposited, excess copper is removed from the facial plane of the dielectric, leaving copper in only the etched interconnect features of the dielectric. Subsequent layers are produced similarly before assembly into the final semiconductor package.

In one process Cu or other metal seed is applied by PVD or CVD in a thin or discontinuous layer into features such as vias and trenches, and in some instances it is more in the nature of islands than a layer. This metal seed then provides electrical conductivity for electrodeposition of Cu to fill the features.

Electrolytic Cu systems have been developed which rely on so-called "superfilling" or "bottom-up growth" to deposit Cu into high aspect ratio features. Superfilling involves filling a feature from the bottom up, rather than at an equal rate on all its surfaces, to avoid seams and pinching off that can result in voiding. Systems consisting of a suppressor and an accelerator as additives have been developed for superfilling. As the result of momentum of bottom-up growth, the Cu deposit is thicker on the areas of interconnect features than on the field area that does not have features. These overgrowth regions are commonly called overplating, mounding, bumps, or humps. Smaller features generate higher overplating humps due to faster superfill speed. The overplating poses challenges for later chemical and mechanical polishing processes that planarize the Cu surface. A third organic additive called a "leveler" is typically used to reduce the overgrowth.

As chip architecture gets smaller, with interconnects having openings on the order of 100 nm and smaller through which Cu must grow to fill the interconnects, there is a need for enhanced bottom-up speed. That is, the Cu must fill "faster" in the sense that the rate of growth on the feature bottom must be substantially greater than the rate of growth on the rest of areas, and even more so than in conventional superfilling of larger interconnects.

In addition to superfilling and overplating issues, microdefects may form when electrodepositing Cu for filling interconnect features. One defect that can occur is the formation of internal voids inside the features. As Cu is deposited on the feature side walls and top entry of the feature, deposition on the side walls and entrance to the feature can pinch off and thereby close access to the depths of the feature especially with features which are small (e.g., <100 nm) and/or which have a high aspect ratio (depth:width) if the bottom-up growth rate is not fast enough. Smaller feature size or higher aspect ratio generally requires faster bottom-up speed to avoid pinching off. Moreover, smaller size or higher aspect ratio features tend to have thinner seed coverage on the sidewall and bottom of a via/trench where voids can also be produced due to insufficient copper growth in these areas. An internal void can interfere with electrical connectivity through the feature.

Microvoids are another type of defect which can form during or after electrolytic Cu deposition due to uneven Cu growth or grain recrystallization that happens after Cu plating.

In a different aspect, some local areas of a semiconductor substrate, typically areas where there is a Cu seed layer deposited by physical vapor deposition, may not grow Cu during the electrolytic deposition, resulting in pits or missing metal defects. These Cu voids are considered to be "killer defects," as they reduce the yield of semiconductor manufacturing products. Multiple mechanisms contribute to the formation of these Cu voids, including the semiconductor substrate itself. However, Cu electroplating chemistry has influence on the occurrence and population of these defects.

Other defects are surface protrusions, which are isolated deposition peaks occurring at localized high current density sites, localized impurity sites, or otherwise. Copper plating chemistry has influence on the occurrence of such protrusion defects. Although not considered as defects, Cu surface roughness is also important for semiconductor wafer manufacturing. Generally, a bright Cu surface is desired as it can reduce the swirl patterns formed during wafer entry in the plating solution. Roughness of Cu deposits makes it more difficult to detect defects by inspection, as defects may be concealed by peaks and valleys of rough surface topography. Moreover, smooth growth of Cu is becoming more important for flawlessly filling of fine interconnect structures as the roughness can cause pinch off of feature and thereby close access to the depths of the feature. It is generally recognized that Cu electroplating chemistry, including suppressor, accelerator, and leveler, has great influence on the roughness of Cu deposits, thus presenting challenges in chemistry formulation.

SUMMARY OF THE INVENTION

It is an object of the invention, therefore, to simplify deposition of copper into electrical interconnects, improve the quality of such copper deposition, and avoid certain of the challenges associated with electrolytic deposition of copper in this context.

Briefly, therefore, the invention is directed to a method for plating Cu onto a semiconductor integrated circuit device substrate having an electrical interconnect feature having a bottom, sidewalls, and top opening in a dielectric material, the method comprising forming an initial metal deposit in the feature which has a profile comprising copper metal on the bottom of the feature and a segment of the sidewalls having essentially no copper metal thereon; and depositing copper onto the initial metal deposit to fill the feature with copper.

Other objects and features of the invention will be in part apparent and in part pointed out hereinafter.

BRIEF DESCRIPTION OF THE FIGURES

FIGS. 1A through 1E are a schematic illustration of one distinct embodiments of the invention.

FIGS. 4A through 4D are a schematic illustration of one distinct embodiments of the invention.

FIGS. 5A through 5D are a schematic illustration of one distinct embodiments of the invention.

DETAILED DESCRIPTION OF THE EMBODIMENT(S) OF THE INVENTION

Figure 2A:
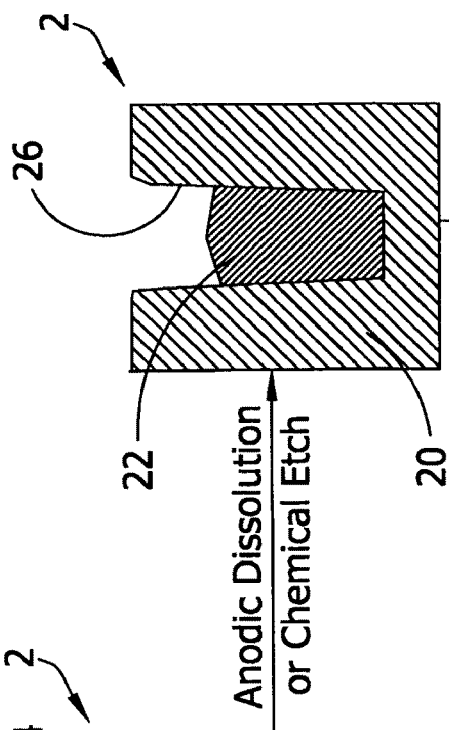
FIGS. 2A through 2E are a schematic illustration of one distinct embodiments of the invention.

The present invention is directed to a method of metallizing an interconnect feature located in a microelectronic device substrate. The interconnect feature is a trench or via located in a semiconductor substrate and has a bottom, a sidewall, and an opening. Typical dimensions of the opening, i.e., diameter of a via opening (commonly referred to as a node) or width of a trench, are typically less than about 500 nm, but more typically nodes are less than about 250 nm and may be as little as about 10 nm, i.e., the opening dimension is typically between about 10 nm and about 500 nm. Common nodes include 130 nm, 90 nm, 65 nm, 45 nm, 32 nm, 22 nm, and 15 nm. Typical depths may range from about 2000 nm to about 200 nm, such as about 1000 nm, about 700 nm, about 500 nm, or about 300 nm. In view of these diameters and depths, interconnect features may be characterized as having aspect ratios in terms of depth:opening diameter between about 20:1 and about 0.2:1, typically between about 10:1 and about 1:1, such as about 7:1, about 5:1, and about 3:1.

These features are located in a dielectric layer, the dielectric layer located on a semiconductor substrate. The semiconductor substrate may be, for example, a semiconductor wafer or chip. The semiconductor substrate is typically a silicon wafer or silicon chip, although other semiconductor materials, such as germanium, silicon germanium, silicon carbide, silicon germanium carbide, and gallium arsenide are applicable to the method of the present invention.

The semiconductor substrate may have deposited thereon a dielectric (insulative) layer, such as, for example, $SiO_2$, silicon nitride, silicon oxynitride, carbon-doped silicon oxides, or low-κ dielectrics. The dielectric film is typically deposited by conventional methods on the surface of the semiconductor wafer or chip and then the top-field surface of the dielectric layer is etched, by conventional lithography, to achieve the circuitry pattern comprising the aforementioned vias and trenches. Low-κ dielectric refers to a material having a smaller dielectric constant than silicon dioxide (dielectric constant=3.9). Low-κ dielectric materials are desirable since such materials exhibit reduced parasitic capacitance compared to the same thickness of $SiO_2$ dielectric, enabling increased feature density, faster switching speeds, and lower heat dissipation. Low-κ dielectric materials can be categorized by type (silicates, fluorosilicates and organo-silicates, organic polymeric etc.) and by deposition technique (CVD; spin-on). Dielectric constant reduction may be achieved by reducing polarizability, by reducing density, or by introducing porosity.

Prior to copper metallization, a barrier layer is deposited onto the bottoms and sidewalls of interconnect features located in the substrate's dielectric layer. Barrier layer materials may be selected from among tantalum, tantalum nitrogen composite, titanium, titanium nitrogen composite, tungsten, tungsten nitrogen composite, titanium silicon nitride, and manganese oxide, among others. The barrier layer may comprise one or more than one layer comprising the above-described materials, such as a layer of tantalum and a layer of tantalum-nitride composite, in one example. For 32 nm generation node or below, a ruthenium layer may be applied on top of the barrier to allow for direct copper plating without copper seeds or with reduced amount of copper seeds. The ruthenium layer also promotes the adhesion between the barrier layer and copper metallization and thus it is often called a "glue layer". Barrier layers comprising these materials are known for effectively blocking copper diffusion into the semiconductor's junctions and thereby maintain the integrity of the copper fill.

These diffusion barriers, the glue layer, and copper seeding may be deposited onto the bottom and sidewalls of the interconnect feature by methods known in the art, such as physical vapor deposition (PVD), plasma-enhanced physical vapor deposition (PE-PVD), chemical vapor deposition (CVD), plasma-enhanced chemical vapor deposition (PE-CVD), and atomic layer deposition (ALD). The diffusion barrier layer is typically deposited to a thickness between about 50 nm and about 5 nm, more typically deposited to a thickness between about 25 nm and about 15 nm.

Copper seeding may be by conventional methods, such as chemical vapor deposition and physical vapor deposition. Copper seeding by CVD and PVD is typically non-selective, such that copper is additionally deposited on the top-field surface of the dielectric film. In a typical seeding operation, conditions are generally controlled so as to deposit a copper seed having a thickness about 150 nm on the bottom and sidewall of the feature, while the thickness of the copper seed is generally about 30 nm on the top-field surface of the dielectric. However, the thickness of the copper seed inside the features can be much thinner than that on the field. In some extreme cases, the coverage on feature bottoms approaches zero and copper seeds become non-continuous there.

In the method of the present invention, bottom-up filling of trench/via structures in microelectronic devices occurs by an electroless copper deposition process, by an electrolytic copper deposition process, or by a combination of electroless and electrolytic copper deposition processes. In one preferred embodiment, the invention employs electrolytic copper deposition, followed by removal of copper deposits from feature sidewall, followed by electroless copper deposition to bottom-up fill interconnect features. In one embodiment, the invention employs a copper seeded substrate and involves at least partial removal of the seeding from the feature sidewall followed by electroless and/or electrolytic copper deposition. In one embodiment, the invention employs electrolytic copper deposition followed by electroless copper deposition to bottom-up fill interconnect features.

The process steps for one embodiment of the invention are illustrated in FIGS. 1A through 1E. FIG. 1A depicts a metal seeded semiconductor interconnect substrate 1 such as copper seed 12 located on the bottom and sidewall of an interconnect feature and on the top-field surface of the dielectric layer 10. In all these images, the substrate is depicted in cross section. The cross section is a thin slice of the substrate such that the back sides of the features are not shown. Moreover, for the sake of clarity, certain features, such as the semiconductor substrate and the barrier layer, are not shown, but it should be understood that these features are part of the semiconductor interconnect substrate. With reference now to FIG. 1B, in this process embodiment, copper is deposited electrolytically to yield a partially filled feature, wherein there is copper metallization located in the bottom, on the side walls 14, and on the top of the substrate. Preferably, conditions are optimized to deposit more copper on the bottom of the feature than on the sidewall of the feature and top-field surface. In a variation on this process embodiment, the interconnect feature may be partially filled by electroless copper deposition to yield the partially filled feature shown in FIG. 1B. Copper is then removed from the side wall and top field by anodic dissolution or chemical etching to yield a partially etched feature, as shown in FIG. 1C, wherein, preferably, the copper metal is located predominantly on the bottom of the feature. Electroless copper deposition is then used for bottom-up copper filling to yield the filled interconnect feature having some overgrowth, as shown in FIG. 1D. Because the selected electroless process by its nature does not deposit copper onto dielectric, copper does not grow from the sidewalls or from the top-field, such that many of the issues of pinching and voiding from Cu growth in non-vertical directions are avoided. In a variation on this process embodiment, the interconnect feature may be filled by electrolytic copper deposition to yield the filled feature shown in FIG. 1D. Then the workpiece is subjected to conventional finishing operations of annealing and chemical-mechanical polishing (CMP) to yield a metallized interconnect feature in which the copper metallization is planar with the field of the dielectric, as shown in FIG. 1E.

The manner of deposition of the initial electrolytic copper partial fill is not critical to the performance of the invention. Conventional electrolytic copper chemistry such as ViaForm® available from Enthone Inc. of West Haven, Conn. may be employed and prepared according to the manufacturer's instructions. The chemistry and process parameters are, for example, akin to those disclosed in U.S. Pub. Nos. 2005/0045488; 2006/0141784; and 2007/0178697, the entire disclosures of which are incorporated by reference. Electrolytic copper deposition for filling interconnect features generally employs the three-additive system of leveler, suppressor, and accelerator. Levelers include, for example, those available from Enthone Inc. under the trade name ViaForm L700 or ViaForm NEXT™ Leveler. The leveler is incorporated, for example, in a concentration between about 0.1 mg/L and about 25 mg/L. Accelerators are bath soluble organic divalent sulfur compounds as disclosed in U.S. Pat. No. 6,776,893, the entire disclosure of which is expressly incorporated by reference. An example of a suitable accelerator is ViaForm Accelerator also available from Enthone Inc. The accelerator is incorporated typically in a concentration between about 0.5 and about 1000 mg/L, more typically between about 2 and about 50 mg/L, such as between about 5 and 30 mg/L. Suppressors typically comprise a polyether group covalently bonded to a base moiety. One class of applicable suppressors comprises a polyether group covalently bonded to an amine moiety. Exemplary suppressors include ViaForm Suppressor or ViaForm Extreme Suppressor. These suppressor compounds described above can be present in an overall bath concentration between about 10 mg/L to about 1000 mg/L, preferably between about 50 mg/L to about 200 mg/L.

A wide variety of copper sources and acids are potentially applicable, with copper sulfate/sulfuric acid and copper methanesulfonate/methanesulfonic acid systems currently preferred. In embodiments wherein the copper source is a sulfate-based source, the concentration of copper typically ranges from about 5 g/L to about 75 g/L, such as between about 5 g/L and about 30 g/L or between about 30 g/L and about 75 g/L. Copper methanesulfonate is a more soluble source of copper, and the copper concentration may range more widely, such as from about 5 g/L to about 135 g/L, such as between about 75 g/L and about 135 g/L copper.

Chloride ion may also be used in the bath at a level up to 200 mg/L, preferably about 10 to 90 mg/L. Chloride ion is added in these concentration ranges to enhance the function of other bath additives. Other additives (usually organic additives) may be employed for grain refinement, suppression of dendritic growth, and improved covering and throwing power. Typical additives used in electrolytic plating are discussed in a number of references including Modern Electroplating, edited by F. A. Lowenheim, John Reily & Sons, Inc., 1974, pages 183-203.

Electrolysis conditions such as electric current concentration, applied voltage, electric current density, and electrolytic solution temperature are essentially the same as those in conventional electrolytic copper plating methods. For example, the bath temperature is typically about room temperature such as about 20-27° C., but may be at elevated temperatures up to about 40° C. or higher. An external source of electrons is applied to yield an electrical current density typically up to about 100 mA/cm$^2$, typically between about 2 mA/cm$^2$ to about 60 mA/cm$^2$. It is preferred to use an anode to cathode ratio of about 1:1, but this may also vary widely from about 1:4 to 4:1. The process also uses mixing in the electrolytic plating tank which may be supplied by agitation or preferably by the circulating flow of recycle electrolytic solution through the tank. The flow through the electrolytic plating tank provides a typical residence time of electrolytic solution in the tank of less than about 1 minute, more typically less than 30 seconds, e.g., 10-20 seconds.

Since, in one embodiment of the invention, electrolytic copper deposition may be utilized to partially fill the interconnect feature, the duration and current density are controlled to prevent full electrolytic fill. For example, in partially filling an interconnect trenches having an opening width of 140 nm and a depth of 600 nm (aspect ratio=4:1), employing a conventional electrolytic copper deposition chemistry at a current density of about 100 A/dm$^2$ for between about 15 seconds and about 30 seconds, may be expected to fill about 30% and about 80% of the volume of the feature. Stated another way, the conditions are generally controlled to yield a partially filled interconnect feature in which the thickness of the copper deposit on the bottom typically between about 50 nm and about 600 nm, while the thickness of the copper seed is generally between about 50 nm and about 1 nm on the sidewalls of the feature. Conditions, i.e., current density and plating chemistry, are preferably optimized to deposit copper according to a bottom-up growth mechanism, such that copper deposits preferably on the bottom of the feature as opposed to the feature sidewall.

As stated above, anodic dissolution or chemical etching may be employed to remove from the plane of the wafer and on the feature sidewall to yield a partially filled feature as shown in FIG. 1C, in which copper remains essentially on the bottom of the feature only, while the sidewalls are essentially free of copper deposit. Chemical etching involves contacting the partially filled interconnect feature with a conventional corrosive, etching solution. This results in dissolution of copper from the top-field surface, sidewall of the feature, and bottom of the feature. The dissolution is stopped once all copper is removed from the sidewalls. Since the copper thickness on the sidewall is much less than on the bottom, the exposure duration may be controlled to leave copper on the bottom as shown in FIG. 10.

Such contact may be by immersion, spraying, flooding, etc., with the proviso that the contact method is sufficient to etch copper from the feature sidewall. There is a wide selection of chemicals that can be used for copper removal, such as many kinds of acids, oxidizers, alkaline solution, carbonates, etc. The process parameters are best determined empirically, such that actual values necessary to achieve sufficient copper deposition on the bottom of the feature and copper cleaning from the sidewalls may vary from those exemplified herein.

Alternatively, copper may be removed from the wafer plane and sidewall by anodic dissolution involving reversing the polarization so as to make the substrate the anode. This results in dissolution of Cu from top, sidewalls, and bottom. The dissolution is stopped once a substantial portion of copper is removed from the sidewalls. Since the copper thickness on the sidewalls is greater than on the bottom in the second image, stopping the dissolution at this point leaves copper on the bottom as shown in FIG. 10. In one example, anodic dissolution at a reverse current density between about 500 A/dm$^2$ and about 100 A/dm$^2$ may be expected to remove copper (by oxidation) at a rate of about 185 angstroms/second and about 37 angstroms/second. Generally, the conditions used for electrolytic copper metallization sufficient to achieve an acceptable copper deposit on the bottom and sidewalls of the feature and chemical etching or anodic dissolution of copper on the sidewalls of the feature are best determined empirically, taking into account factors such as feature diameter and depth, the rate of copper metallization, and the rate of copper dissolution. The numbers provided above are exemplary, and it should be understood that actual values of current density, etc., will depend upon the above-described process parameters.

In either embodiment, it is preferred that electrolytic copper deposition on the bottom of the feature fills between about 5% and about 100% of the feature depth, more preferably between about 30% and about 60% of the feature depth. Preferably, anodic dissolution or chemical etching cleans the copper sidewalls in a manner such that the sidewalls have essentially no copper deposited thereon prior to the next copper deposition step.

With respect to the electroless deposition, it is performed under conventional parameters disclosed in the art such as in U.S. Pat. Nos. 4,617,205; and 6,897,152, the entire disclosures of which are incorporated by reference. As disclosed therein, the electroless copper deposition composition comprises a source of copper ions, a pH adjusting agent/buffer, a reducing agent, and other, optional bath components.

The copper ions preferably have a valency of +2. Any appropriate electronics grade copper-containing compound may be used to supply the copper ions. For example, the copper-containing compound is preferably selected from the group consisting of copper(II) methanesulfonate, copper(II) sulfate, copper(II) chloride, copper(II) acetate, copper(II) nitrate, copper(II) carbonate, copper(II) hydroxide, copper (II) iodide, and hydrates of the foregoing compounds. In a particularly preferred embodiment of the present invention the copper-containing compound is copper(II) sulfate pentahydrate ($CuSO_4.5H_2O$). The concentration of copper ions in the solution is preferably between about 0.008 and about 0.08 M, and more preferably between about 0.02 and about 0.06 M. Thus, the amount of copper(II) sulfate pentahydrate in the copper plating solution is preferably between about 2 and about 20 g/L, and more preferably between about 5 and about 15 g/L.

A preferred system here is an EDTA complexed Cu system reduced by glyoxylate with TMAH as a base. The electroless copper deposition composition comprises a reducing agent that reduces the copper(II) ions to copper metal to enable electroless plating. The reducing agent may be selected, for example, from glyoxylic acid or formaldehyde. A preferred reducing agent is glyoxylic acid or a glyoxylate salt, such as sodium glyoxylate monohydrate. The concentration of the glyoxylic acid in the solution may be between about 0.027 and about 0.27 M (between about 2 and about 20 g/l). In another preferred embodiment, the concentration of the glyoxylic acid is between about 0.07 and about 0.14 M (between about 5 and about 10 g/l).

Hydroxide ions are included in the plating solution to neutralize the hydrogen ions ($H^+$) generated, e.g., by the copper compounds, the complexing agent, and the reducing agent. Additionally, the hydroxide ions participate in the chemical reduction of the copper ions to copper metal. Preferably, the hydroxide ions are supplied from tetramethylammonium hydroxide (TMAH). The bath preferably does not contain any mobile ions such as alkali metal ions associated with other hydroxide sources which might be considered (e.g., NaOH, KOH, LiOH, etc.), as such ions may be critical contaminants for CMOS devices. Thus, any other hydroxide-containing compounds included in the solution are preferably substantially free of alkali metal atoms and/or ions (i.e., the compounds of the solution do not contain more than the typical impurity level of alkali metal atoms and/or ions for electronics grade materials).

The concentration of TMAH in the electroless copper deposition composition is preferably between about 0.39 and about 2.64 M (between about 35 and about 240 g/L). More preferably, the concentration of TMAH in the copper plating solution is between about 1.20 and about 2.20 M (between about 110 and about 200 g/L). Also, the concentration of the TMAH in the copper plating solution is preferably sufficient to yield at least about 10 g/L of unreacted TMAH in the solution after all the acids have been neutralized by the TMAH (e.g., acids from copper compounds, EDTA, and glyoxylic acid). Typically, the pH of the solution is between about 10 and about 14. In one embodiment, the pH of the solution is between about 12.5 and about 13.

A preferred complexing agent is ethylenediaminetetraacetic acid (EDTA), however, other complexing agents may be used with, or in place of, EDTA. Examples of other complexing agents include: hydroxy lower alkyl lower alkylene amines, diamines, triamines and other polyamines or imines, such as tetra-2-hydroxypropyl ethylene diamine (EDTP); lower alkyl carboxylic acid lower alkylene amines, diamines, triamines or polyamines or imines, such as diethylene triamine pentaacetic acid; compounds which have attributes of the foregoing two classes of compounds, e.g., hydroxyalkyl or alkylene carboxylic acid amines, triamines, polyamines or imines, such as N-2-hydroxyethyl ethylene diamine-N,N',N'-triacetic acid; hydroxy mono-, di-, tri- or tetra-carboxylic acids, having, for example, 1 to 6 carbon atoms other than in the carboxylic groups, e.g., gluconate and glucoheptonate; nitrilotriacetic acid; glycolic acid; iminodiacetic acid; polyimines; and ethanolamine.

Any appropriate EDTA-containing compound may be used to supply the EDTA. For example, the EDTA may be supplied as the acid itself and as EDTA-containing salts such as EDTA-(mono, di, tri, or tetra)-(sodium, potassium, or ammonium) salts. Preferably, the EDTA is supplied as the acid itself. The concentration of EDTA in the solution is preferably between about 0.012 and about 0.12 M (between about 3 and about 30 g/L). More preferably, the concentration of EDTA is between about 0.04 and about 0.08 M (between about 10 and about 20 g/L). To ensure the efficient plating of copper, the concentrations of the copper ions and the EDTA are preferably controlled so that the molar ratio of copper to EDTA is between about 1:1 and about 1:2, and more preferably between about 1:1 and about 1:1.5.

The plating solution may also comprise one or more stabilizer compounds to stabilize the solution and control the plating rate during electroless deposition. A stabilizer compound typically forms strong copper (I) complexes that tend to inhibit the formation of copper (I) oxide. An electroless copper stabilizer causes the plating rate at a given copper surface to diminish as the plating time increases. Thus, one reason for including a stabilizer is to prevent uncontrolled copper plating which would rapidly exhaust the plating solution. Specifically, copper particles or solid impurities that may form in the solution will be plated because the electroless plating of copper is autocatalytic, and if the particles are not stabilized, the plating will continue indefinitely until the solution is exhausted. Another benefit of including a stabilizer is that they tend to refine the grain structure of, and improve the ductility of, the plated copper thereby improving the visual appearance of the deposit and enabling easier inspection.

During an electroless copper plating operation, the copper plating solution is preferably maintained at a temperature between about 20 and about 90° C., and more preferably between about 60 and about 80° C. The copper plating solution preferably electrolessly plates at a rate between about 1 and about 10 μm/hr, more typically between about 3 and about 6 μm/hr. As such, to deposit copper on a substrate by electroless deposition, the substrate is typically immersed in, or contacted with, the copper plating solution for a duration that is between about 10 seconds and about 10 minutes. More preferably, the substrate is immersed in the solution for a duration between about 30 and about 180 seconds.

After electroless copper fill, the wafer may be processed by conventional means, such as by chemical mechanical polishing to remove copper overgrowth and stray copper deposit on the dielectric material. Additionally, the copper metallization may be capped, for example, with cobalt-based and nickel-based caps, as disclosed in U.S. Pat. No. 7,268,074 and U.S. Pub. Nos. 2006/0083850 and 2007/0066057.

Figure 2B:
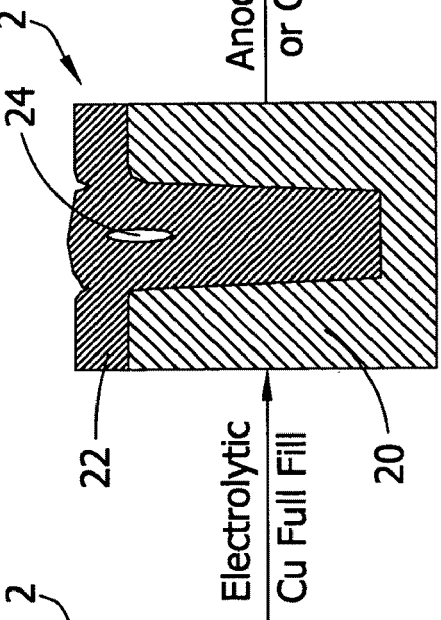
Figure 2C:
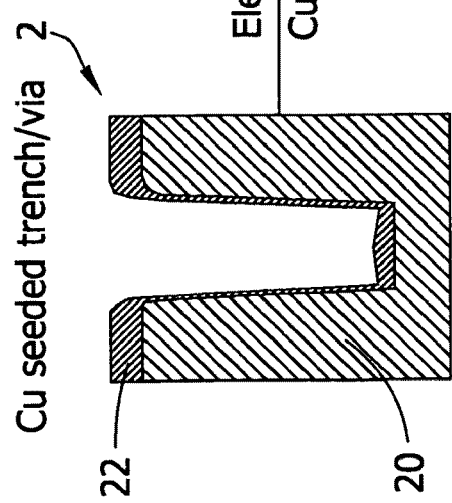
Figure 2D:
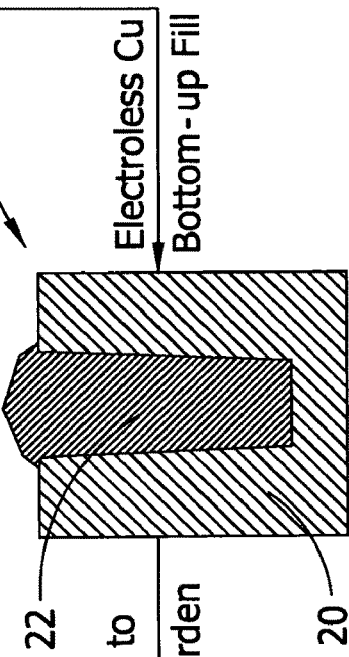
Figure 2E:
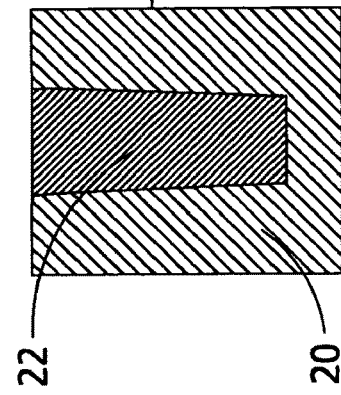

Another embodiment of the invention illustrated in FIGS. 2A through 2E, which employs the same type of substrate, namely, as depicted in FIG. 2A, an electronic device substrate 2 having dielectric 20 having an interconnect feature with Cu seed 22 therein. The features are completely filled electrolytically as in conventional processes, yielding the substrate as shown in FIG. 2B. An exaggerated void is shown at 24 to illustrate a benefit of the invention. In a variation on this process embodiment, the interconnect feature may be filled by electroless copper deposition to yield the filled feature shown in FIG. 2B. Anodic dissolution or chemical etch is used to remove the copper from the bulk, top portion of feature, and top portion of the sidewalls to yield the substrate as shown in FIG. 2C, with Cu-free sidewalls 26. In the process, defects such as 24 are eliminated. Electroless Cu deposition follows to achieve bottom-up filling as shown in FIG. 2D. In a variation on this process embodiment, the interconnect feature may be filled by electrolytic copper deposition to yield the filled feature shown in FIG. 2D. Then the workpiece is subjected to conventional finishing operations of annealing and chemical-mechanical polishing (CMP) to yield a metallized interconnect feature in which the copper metallization is planar with the field of the dielectric, as shown in FIG. 2E.

Figure 3A:
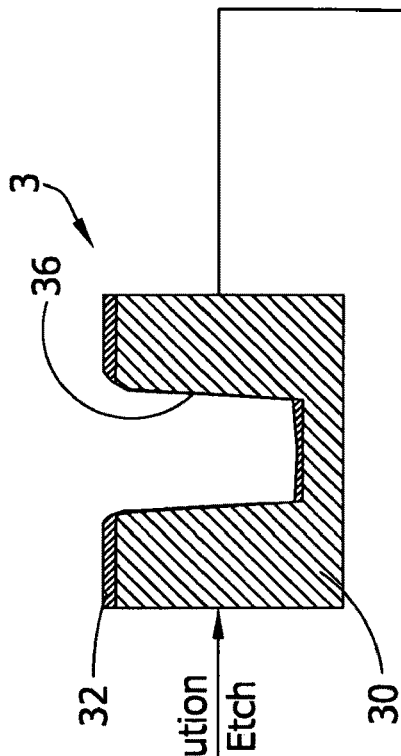
FIGS. 3A through 3D are a schematic illustration of one distinct embodiments of the invention.
Figure 3B:
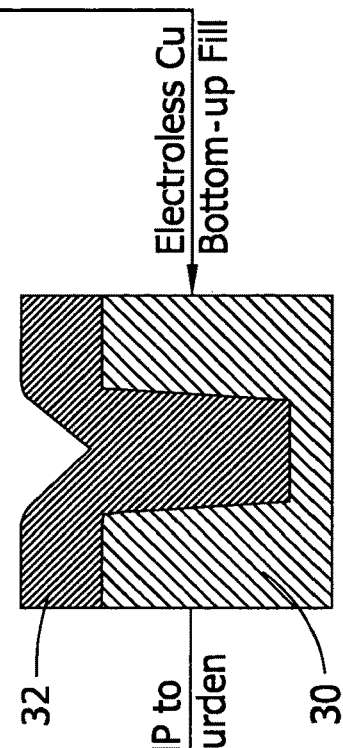

A further alternative embodiment is illustrated in FIGS. 3A through 3D. FIG. 3A depicts a metal seeded semiconductor interconnect substrate 3 such as copper seed 32 located in the bottom and sidewall of an interconnect feature an on the top-field surface of a dielectric layer 30. Anodic dissolution and/or chemical etching are applied to remove part of seed layer 32 from dielectric 30 and substantially all of the seed layer 32 from the sidewall, thus revealing bare walls 36, as shown in FIG. 3B. The seed layer is not removed from the bulk on top of the substrate, and copper seed remains on the bottom of the feature (since, copper seeding is typically thicker on the bottom than on the sidewall of the feature).

Figure 3D:
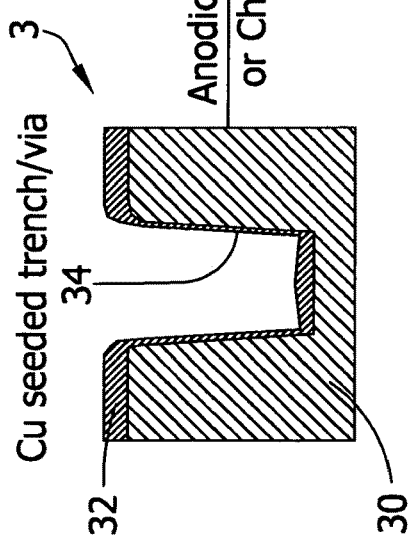
Figure 3C:
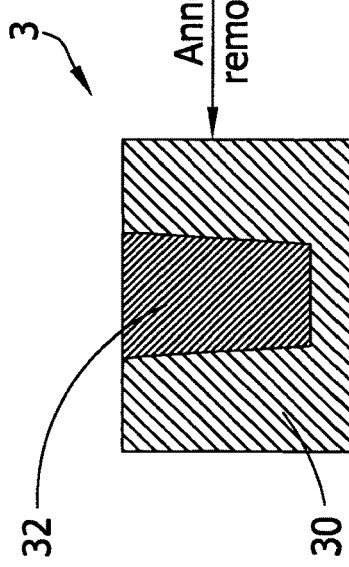

Thereafter electroless deposition is performed to yield the substrate as shown in FIG. 3C. The Cu thickness on the top of the substrate grows due to this electroless deposition. In a variation on this process embodiment, the interconnect feature may be filled by electrolytic copper deposition to yield the filled feature shown in FIG. 3C. Then the workpiece is subjected to conventional finishing operations of annealing and chemical-mechanical polishing (CMP) to yield a metallized interconnect feature in which the copper metallization is planar with the field of the dielectric, as shown in FIG. 3D.

Turning to FIG. 4, in this embodiment as in the embodiment of FIG. 3, electrolytic deposition is not performed. FIG. 4A depicts a metal seeded semiconductor interconnect substrate 4 such as copper seed 42 located in an interconnect feature and on the top-field surface of a dielectric layer 40. Anodic dissolution is performed on the substrate 4 of dielectric 40 with Cu seed 42 including copper-seeded side walls 44. Between the substrate depicted in FIG. 4A and the substrate depicted in FIG. 4B, anodic dissolution is applied and the thinnest seed on the side walls is eliminated first revealing bare side walls 46. Continuing anodic dissolution, the overburden on the top is removed, but the seed on the bottom of the feature remains. That is, the elimination of copper from the side walls 46 interrupts current flow to the bottom of the feature, thus stopping further dissolution from the bottom. In an alternative, the substrate 4 may be chemically etched to achieve the substrate depicted in FIG. 4B. Then electroless copper deposition is performed as between the substrate depicted in FIG. 4B and the substrate depicted in FIG. 4C, yielding the filled feature shown in FIG. 4C. In a variation on this process embodiment, the interconnect feature may be filled by electrolytic copper deposition to yield the filled feature shown in FIG. 4C. Then the workpiece is subjected to conventional finishing operations of annealing and chemical-mechanical polishing (CMP) to yield a metallized interconnect feature in which the copper metallization is planar with the field of the dielectric, as shown in FIG. 4D.

A common aspect of each of these embodiments is that it involves forming an initial Cu deposit in the feature which has a profile comprising metal on the bottom of the feature and a segment of the sidewalls having essentially no metal thereon. This is represented by FIGS. 1C and 2C, and by FIGS. 3B and 4B.

The process steps of another embodiment of the invention are illustrated in FIGS. 5A through 5D. A metal seeded semiconductor interconnect substrate such as Cu-seeded substrate 5 as shown in FIG. 5A is employed which has dielectric 50 and Cu seed 52. Copper is deposited electrolytically to yield the substrate shown in FIG. 5B, where there is additional Cu in the bottom, on the side walls 54, and on the top of the substrate. Electrolytic copper deposition reduces the feature aspect ratio. Electroless Cu deposition is then used to complete bottom-up filling as shown in FIG. 5C. Electroless deposition also deposits Cu 56 over the top surface. Then the workpiece is subjected to conventional finishing operations of annealing and chemical-mechanical polishing (CMP) to yield a metallized interconnect feature in which the copper metallization is planar with the field of the dielectric, as shown in FIG. 5D.

An alternative process combines aspects of a conformal deposition of a metal that is wettable with copper, such as a ruthenium (Ru) layer, an iridium layer, or a cobalt layer, and non-conformal vapor deposited copper. The copper wettable metal, such as, in a preferred embodiment, ruthenium, is deposited on the Ta/TaN barrier surface of a wafer with trenches and/or vias to achieve both global and local conductivity. Ruthenium acting as a glue layer also greatly improves the adhesion of copper to the semiconductor substrates in sequential copper deposition. The copper wettable metal may be deposited by conventional techniques. For example, ruthenium may be deposited onto the bottom and sidewalls of the interconnect feature by methods known in the art, such as physical vapor deposition (PVD), plasma-enhanced physical vapor deposition (PE-PVD), chemical vapor deposition (CVD), plasma-enhanced chemical vapor deposition (PE-CVD), atomic layer deposition (ALD), electroless deposition, or electrolytic deposition. The copper wettable metal layer is typically deposited to a thickness between about 1 nm and about 50 nm, more typically to a thickness between about 2 nm and about 10 nm.

Figure 6:
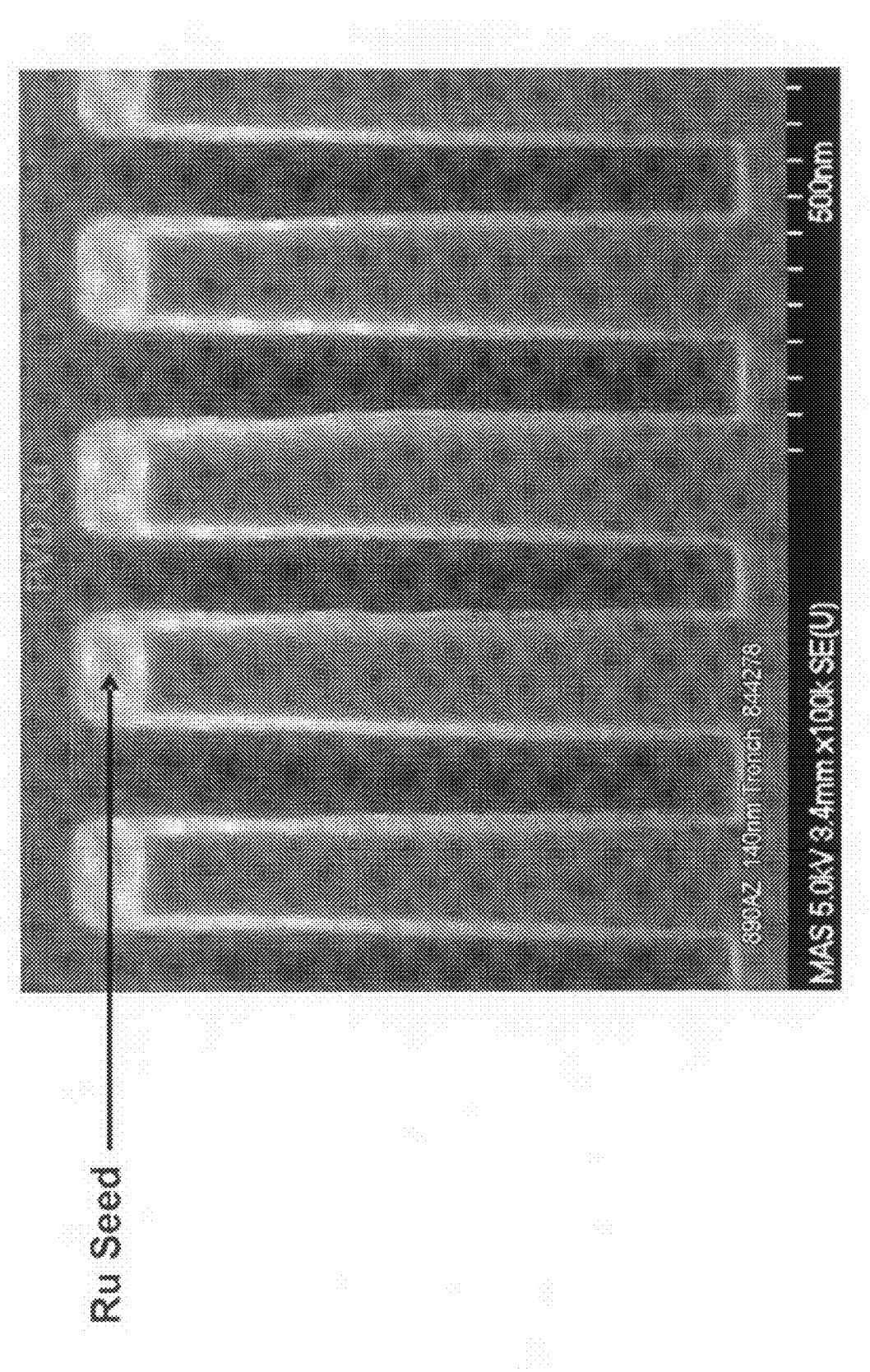
FIG. 6 is a SEM image of a seeded test trench structure that has continuous copper seed coverage on a Ru/Ta barrier stack.

After deposition of the copper wettable metal layer, a low-thickness copper seed layer is deposited by physical vapor deposition, chemical vapor deposition, atomic layer deposition, electrolytic copper deposition, or electroless copper deposition on the bulk of the substrate. In a preferred embodiment, the copper seed layer is deposited by physical vapor deposition. The copper seed layer has a low thickness and is generally deposited to a thickness between about 1 nm and about 50 nm, more typically to a thickness between about 2 nm and about 5 nm. Thereafter, copper is deposited electrolytically to complete the filling of the features and top coverage. FIG. 6 shows the substrate with the ruthenium layer in the features and on the top, with the PVD-deposited copper layer thereover. The ruthenium layer provides complete coverage within the features. The PVD-deposited copper provides complete coverage on the top field without filling in the features. At especially small feature sizes, e.g., 32 nm and below, PVD-deposited copper suffers from issues of overhang and limited sidewall coverage, which can lead to voiding and other defects. The ruthenium seed, which may be deposited by ALD, CVD, electroless, or electrolytically, overcomes these issues because its conformal coverage does not yield overhang and provides uniform in-feature coverage. But a ruthenium seed, being just as thin on the top field as in the feature, is too thin to support required global conductivity to achieve global uniformity by subsequent electrodeposition on the top field, i.e., wafer-scale. It is difficult to achieve bottom-up fill by direct damascene copper plating on ruthenium, since it very often leads to conformal copper growth. The top-field copper seed layer deposition of the present invention overcomes these issues. This PVD copper layer also provides a measure of oxidation protection for the oxidation-prone Ru, therefore providing process flexibility for longer queue times, i.e., shelf-life, of the seed layer. As a result, sequential damascene copper electrodeposition achieves good global uniformity through good conductivity of PVD Cu layer on the top field, and through the continuous Ru layer in the features.

Having described the invention in detail, it will be apparent that modifications and variations are possible without departing from the scope of the invention defined in the appended claims.

EXAMPLES

The following non-limiting examples further illustrate the present invention.

Example 1

Copper Metallization of Trenches

Figure 7:
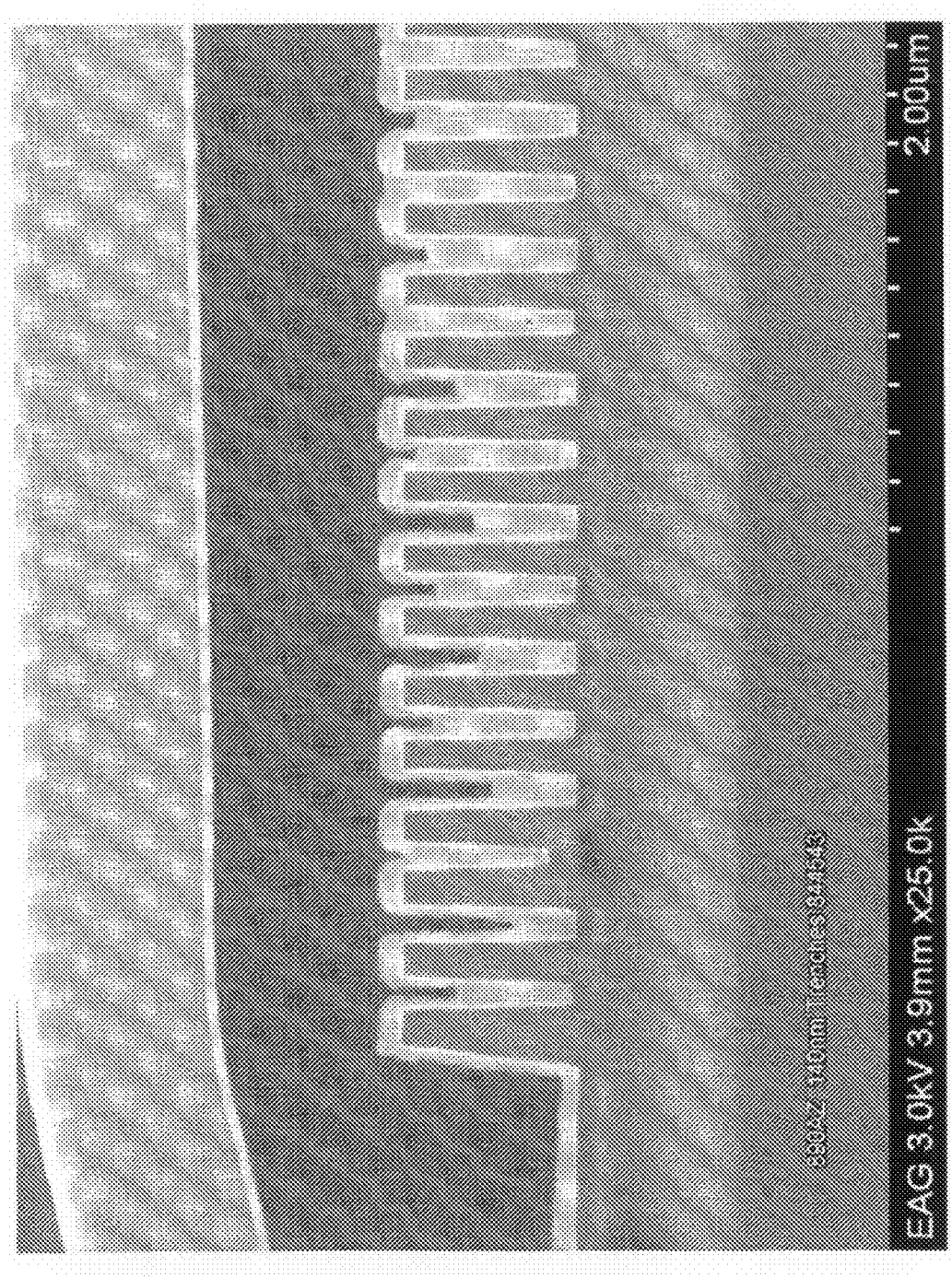
FIG. 7 is a SEM image showing the same test trenches partially filled by electrolytic damascene plating process.
Figure 8:
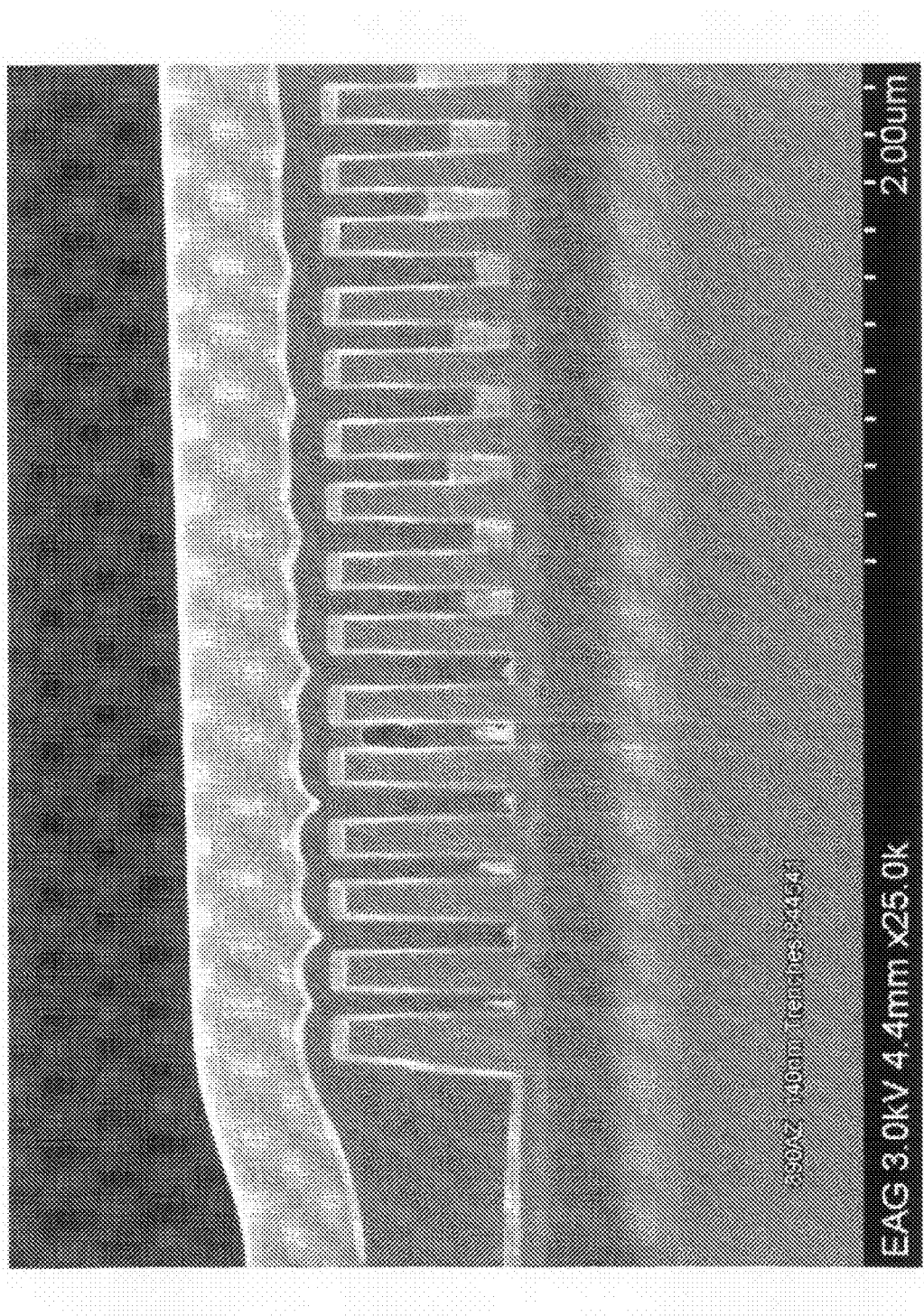
FIG. 8 is a SEM image of the same test trenches wherein copper on feature sidewalls and top-field is removed by chemical etching.
Figure 9:
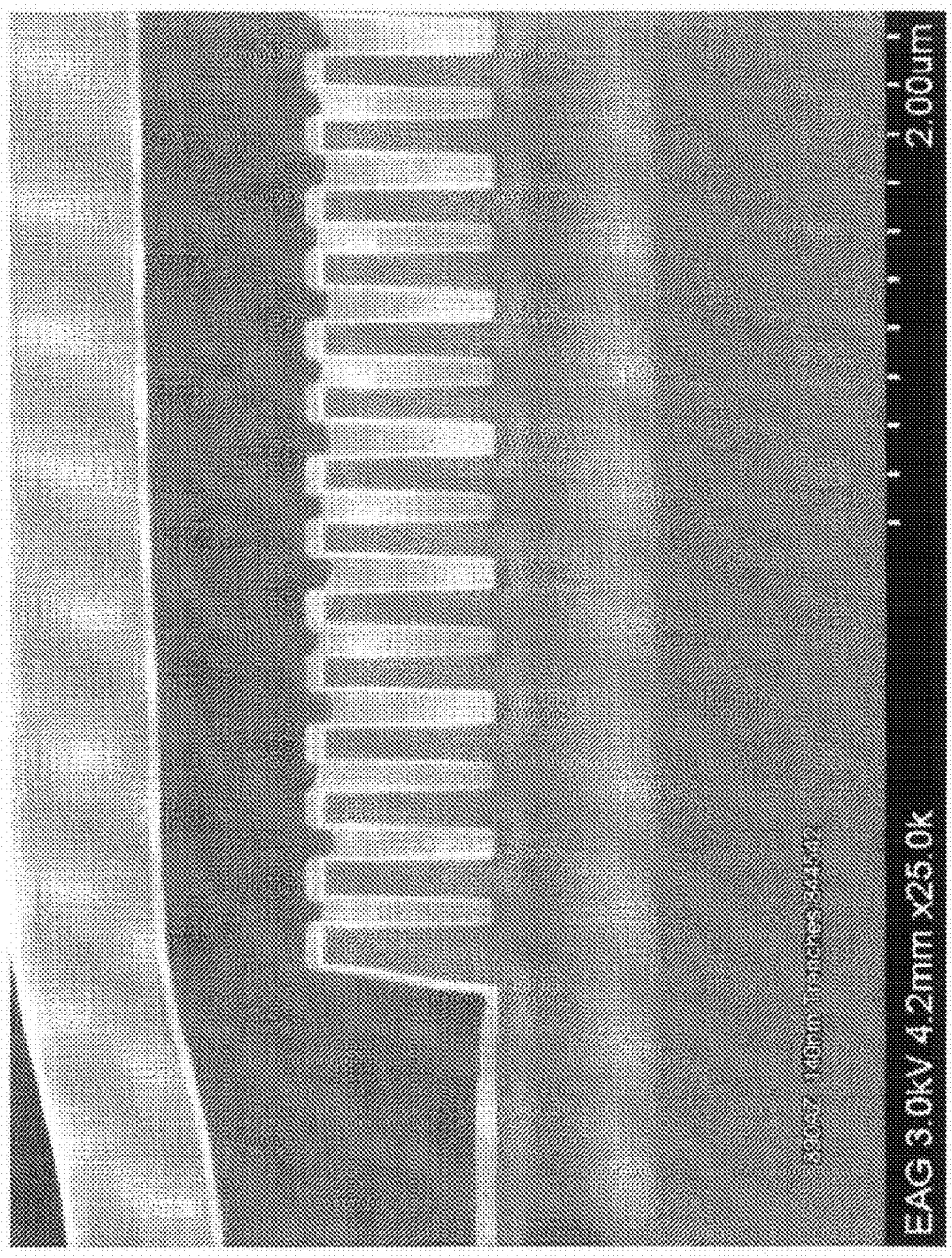
FIG. 9 is a SEM image showing the same test trenches filled by bottom-up electroless copper deposition.

The process described in connection with FIGS. 1A through 1E was carried out and SEM images were obtained at various points in the process. FIG. 7 is a SEM image taken after electrolytic copper partial fill, and shows the damascene copper deposit is thickest on the bottom with a limited amount of growth on the side walls and top field. This was performed at 10 mA/cm$^2$ current density for 30 seconds with ViaForm® LA Makeup chemistry available from Enthone Inc. of West Haven, Conn. with 6 mL/L ViaForm® Extreme accelerator and 2 mL/L ViaForm® Extreme suppressor. The chemical etching step to achieve the substrate depicted in FIG. 1C was then performed by 20 minutes immersion in saturated $(NH_4)_2CO_3$ to yield the workpiece shown in the SEM image of FIG. 8. All the copper is removed from the sidewalls and top field, and residual copper is retained on the bottom of the features. FIG. 9 is a SEM image showing the results of electroless Cu bottom-up fill step, which is depicted in FIG. 1D. The electroless Cu deposits from the bottom upwardly since there is a proper initiating surface only at the bottom, and the side walls are not activated.

When introducing elements of the present invention or the preferred embodiment(s) thereof, the articles "a", "an", "the" and "said" are intended to mean that there are one or more of the elements. For example, that the foregoing description and following claims refer to "an" interconnect means that there are one or more such interconnects. The terms "comprising", "including" and "having" are intended to be inclusive and mean that there may be additional elements other than the listed elements.

As various changes could be made in the above without departing from the scope of the invention, it is intended that all matter contained in the above description and shown in the accompanying drawings shall be interpreted as illustrative and not in a limiting sense. The scope of invention is defined by the appended claims and modifications to the embodiments above may be made that do not depart from the scope of the invention.

What is claimed is:

1. A method for metallizing an electrical interconnect feature with copper, the electrical interconnect feature being located in a dielectric material on a semiconductor integrated circuit device substrate, wherein the dielectric material has a top-field surface and the electrical interconnect feature has a bottom, a sidewall having a depth and a top opening having an opening dimension, the method comprising:
   forming a deposit on the bottom and the sidewall of the electrical interconnect feature, the deposit comprising a copper wettable metal;
   forming a copper-based deposit on the top-field surface;
   forming an initial metal profile in the electrical interconnect feature, the initial metal profile comprising copper metal deposited on the bottom of the electrical interconnect feature and a segment of the sidewall having essentially no copper metal thereon, wherein the initial metal profile is formed by (i) depositing a copper seed layer on the bottom and the sidewall of the interconnect feature and (ii) dissolving a portion of the copper seed layer to thereby form the initial metal profile;
   partially filling the interconnect feature by electrolytic Cu deposition between said (i) depositing the copper seed layer on the bottom and the sidewall of the interconnect feature and said (ii) dissolving the portion of the copper seed layer; and
   filling the electrical interconnect feature having the initial metal profile with copper to thereby metallize the electrical interconnect feature.

2. The method of claim 1 wherein the electrical interconnect feature is filled with copper by contacting the substrate with an electrolytic copper deposition composition and applying an external source of electrons to thereby metallize the interconnect feature with electrolytically deposited copper.

3. The method of claim 1 wherein the copper wettable metal is selected from the group consisting of ruthenium, iridium, and cobalt.

4. The method of claim 1 wherein the opening dimension is between about 10 nm and about 500 nm.

5. The method of claim 1 wherein the depth is between about 200 nm to about 2000 nm.

6. The method of claim 1 wherein the electrical interconnect feature is filled with copper by contacting the substrate with an electroless copper deposition composition to thereby metallize the interconnect feature with electrolessly deposited copper.

7. The method of claim 1 wherein the copper wettable metal is ruthenium.

8. The method of claim 1 wherein the copper wettable metal is iridium.

9. The method of claim 1 wherein the copper wettable metal is cobalt.

10. The method of claim 1 wherein the portion of the copper seed layer is dissolved by anodic dissolution.

11. The method of claim 1 comprising:
   in sequence,
   said forming said deposit of copper wettable metal, wherein said forming said deposit is by a process selected from the group consisting of physical vapor deposition (PVD), plasma-enhanced physical vapor deposition (PE-PVD), chemical vapor deposition (CVD), plasma-enhanced chemical vapor deposition (PE-CVD), and atomic layer deposition (ALD), wherein the copper wettable metal is ruthenium;
   said forming the copper-based deposit on the top-field surface and the copper seed layer on the bottom and the sidewall of the interconnect feature, wherein said forming comprises a process selected from the group consisting of physical vapor deposition (PVD), plasma-enhanced physical vapor deposition (PE-PVD), chemical vapor deposition (CVD), plasma-enhanced chemical vapor deposition (PE-CVD), and atomic layer deposition (ALD);
   said partially filling the interconnect feature by electrolytic Cu deposition;
   said dissolving the portion of the copper seed layer to thereby form said initial metal profile comprising the copper metal deposited on the bottom of the electrical interconnect feature and the segment of the sidewall having essentially no copper thereon, wherein said dissolving the portion of the copper seed layer is performed by anodic dissolution; and
   said filling the electrical interconnect feature having the initial metal profile therein with the copper to thereby metallize the electrical interconnect feature.

12. The method of claim 11 wherein said copper-based deposit on the top-field surface is formed by a) said process selected from the group consisting of physical vapor deposition (PVD), plasma-enhanced physical vapor deposition (PE-PVD), chemical vapor deposition (CVD), plasma-enhanced chemical vapor deposition (PE-CVD), and atomic layer deposition (ALD), followed by b) electrolytic deposition.

13. The method of claim 11 wherein said filling the electrical interconnect feature having the initial metal profile therein with the copper to thereby metallize the electrical interconnect feature is performed by electroless Cu deposition.

14. The method of claim 11 wherein the anodic dissolution dissolves said copper based deposit on the top-field surface in addition to said dissolving the portion of the copper seed layer.

15. The method of claim 11 wherein the electrical interconnect feature is filled with copper by contacting the substrate with an electrolytic copper deposition composition and applying an external source of electrons to thereby metallize the interconnect feature with electrolytically deposited copper.

16. A method for metallizing an electrical interconnect feature with copper, the electrical interconnect feature being located in a dielectric material on a semiconductor integrated circuit device substrate, wherein the dielectric material has a top-field surface and the electrical interconnect feature has a bottom, a sidewall having a depth and a top opening having an opening dimension, the method comprising:

in sequence, forming a deposit of copper wettable metal, wherein said forming said deposit is by a process selected from the group consisting of physical vapor deposition (PVD), plasma-enhanced physical vapor deposition (PE-PVD), chemical vapor deposition (CVD), plasma-enhanced chemical vapor deposition (PE-CVD), and atomic layer deposition (ALD), wherein the copper wettable metal is ruthenium;

forming a copper-based deposit on the top-field surface and a copper seed layer on the bottom and the sidewall of the interconnect feature, wherein said forming comprises a process selected from the group consisting of physical vapor deposition (PVD), plasma-enhanced physical vapor deposition (PE-PVD), chemical vapor deposition (CVD), plasma-enhanced chemical vapor deposition (PE-CVD), and atomic layer deposition (ALD);

partially filling the interconnect feature by electrolytic Cu deposition;

dissolving a portion of the copper seed layer to thereby form an initial metal profile comprising copper metal deposited on the bottom of the electrical interconnect feature and a segment of the sidewall having essentially no copper thereon, wherein said dissolving is performed by anodic dissolution, and wherein said dissolving also dissolves said copper based deposit on the top-field surface in addition to said dissolving the portion of the copper seed layer; and filling the electrical interconnect feature having the initial metal profile therein with copper to thereby metallize the electrical interconnect feature, wherein said filling comprises electroless Cu deposition.

* * * * *